United States Patent [19]
Priem et al.

[11] Patent Number: 5,533,187
[45] Date of Patent: * Jul. 2, 1996

[54] MULTIPLE BLOCK MODE OPERATIONS IN A FRAME BUFFER SYSTEM DESIGNED FOR WINDOWING OPERATIONS

[75] Inventors: Curtis Priem, Fremont; Shuen C. Chang, San Jose; Hai D. Ho, Milpitas, all of Calif.

[73] Assignees: Sun Microsystems, Inc, Mountain View; Samsung Semiconductor, Inc., San Jose, both of Calif.

[ * ] Notice: The portion of the term of this patent subsequent to Oct. 29, 2013, has been disclaimed.

[21] Appl. No.: 145,755

[22] Filed: Oct. 29, 1993

(Under 37 CFR 1.47)

[51] Int. Cl.[6] .................................................. G06F 12/00
[52] U.S. Cl. .................. 395/164; 395/162; 365/230.03; 365/230.08; 365/189.12
[58] Field of Search ...................................... 395/162–166, 395/425, 157; 345/185–187, 191, 196, 203; 365/189.01, 189.04, 189.02, 189.12, 230.02, 230.03, 230.05, 230.06, 230.08

[56] References Cited

U.S. PATENT DOCUMENTS

| | | | |
|---|---|---|---|
| 4,648,077 | 3/1987 | Pinkham et al. | 365/189.12 |
| 4,752,893 | 6/1988 | Guttag et al. | 395/166 |
| 4,823,302 | 4/1989 | Christopher | 395/425 |
| 5,046,023 | 9/1991 | Katsura et al. | 395/162 |
| 5,282,177 | 1/1994 | McLaury | 365/230.05 |
| 5,305,278 | 4/1994 | Inoue | 365/230.03 |

Primary Examiner—Mark R. Powell
Assistant Examiner—Kee M. Tung
Attorney, Agent, or Firm—Blakely, Sokoloff, Taylor & Zafman

[57] ABSTRACT

A frame buffer having a memory array, circuitry for accessing the array, a plurality of color value registers for storing a plurality of color values which may be written to the array, and circuitry for writing to the memory cells a data representing a single pixel, for writing simultaneously to the memory cells data representing a number of pixels equal to the number of conductors on the data bus, or for writing simultaneously to the memory cells data representing an entire row of pixels of the array.

24 Claims, 8 Drawing Sheets

MULTIPLE BLOCK MODE OPERATIONS IN A FRAME BUFFER SYSTEM DESIGNED FOR WINDOWING OPERATIONS

BACKGROUND OF THE INVENTION

1. Field of the Invention

This invention relates to computer systems and, more particularly, to methods and apparatus for providing very fast modes for writing data to a frame buffer for display on an output display device.

2. History of the Prior Art

One of the significant problems involved in increasing the speed of operation of desktop computers has been in finding ways to increase the rate at which information is transferred to an output display device. Many of the various forms of data presentation which are presently available require that copious amounts of data be transferred. For example, if a computer output display monitor is operating in a color mode in which 1024×780 pixels are displayed on the screen and the mode is one in which thirty-two bits are used to define each pixel, then a total of over twenty-five millions bits of information must be transferred to the screen with each frame that is displayed. Typically, sixty frames are displayed each second so that over one and one-half billion bits must be transferred each second. This requires a very substantial amount of processing power and, in general, slows the overall operation of the computer.

In order to speed the process of transferring data to the display, various accelerating circuitry has been devised. In general, this accelerating circuitry (often referred to as a graphic rendering device) is adapted to relieve the central processor of the computer of the need to accomplish many of the functions necessary to transfer data to the display. Essentially, these accelerators take over various operations which the central processor would normally be required to accomplish. For example, block transfers of data from one position on the screen to another require that each line of data on the screen being transferred be read and rewritten to a new position on a new line. Storing information within window areas of a display requires that the data available for each window portion be clipped to fit within that window portion and not overwrite other portions of the display. Many other functions require the generation of various vectors when an image within a window on the display is moved or somehow manipulated. When accomplished by a central processing unit, all of these operations require a substantial portion of the time available to the central processing unit. These repetitive sorts of functions may be accomplished by a graphics accelerator and relieve the central processor of the burden. In general, it has been found that if operations which handle a great number of pixels at once are mechanized by a graphics accelerator, then the greatest increase in display speed may be attained.

A problem which has been discovered by designers of graphics accelerator circuitry is that a great deal of the speed improvement which is accomplished by the graphics accelerator circuitry is negated by the frame buffer circuitry into which the output of the graphics accelerator is loaded for ultimate display on an output display device. Typically, a frame buffer offers a sufficient amount of dynamic random access memory (DRAM) to store one frame of data to be displayed. However, transferring the data to and from the frame buffer is very slow because of the manner in which the frame buffers are constructed. Various improvements have been made to speed access in frame buffers. For example, two-ported video random access memory (VRAM) has been substituted for dynamic random access memory (DRAM) so that information may be taken from the frame buffer at the same time that other information is being loaded into the frame buffer.

A flash write mode has been devised for allowing an entire row of a display to be written with a single color in a single access. This flash write mode is useful when the entire display is being cleared. The flash write mode is not, however, able to provide clipping to limited areas or to function with other than an entire row or rows of the display. Consequently, this mode cannot be used when information is being displayed in windows on the screen of an output display. In fact, the speedup provided by the flash write mode is only available in an operation which is used very infrequently. Thus, although a theoretically large number of pixels may be affected using this mode, the flash write operation is used so infrequently that it provides no additional operational speed for the frame buffer.

The typical frame buffer is written in a mode referred to hereinafter as normal mode. In normal mode, each pixel position of the frame buffer is separately addressed and accessed; and the pixel data is sent on the data bus to these addressed positions. For example, with a thirty-two conductor data bus, thirty-two bits defining a pixel may be placed on the bus and sent to positions in the frame buffer memory. If the computer is functioning in a thirty-two bit color mode, this data defines a single pixel; in sixteen bit color mode, two pixels; in eight bit color mode, four pixels. If a frame buffer is addressed a pixel (or two, or four) at a time, then each pixel in the frame buffer may be described by a different individual color; however, this normal mode of operation is very slow.

When text is being written into a document and to the screen by a user, individual pixels are being affected by the manipulation of the keys so the speed at which the pixel information is handled in the frame buffer is not limiting. However, there are many manipulations accomplished by graphical rendering devices in which the need to write each pixel separately to the frame buffer using the normal mode of writing makes the operation very slow. For example, when a text file is first opened in a window on the display, the writing of individual pixels makes the operation very slow. Similarly, when text is scrolled, writing individual pixels makes the operation very slow.

For this reason, a block mode of writing has been devised for frame buffers. In this block mode, the data transferred on the data bus indicates, not pixel values, but control signals signifying whether a pixel is to be written or not. A color register which is a part of the frame buffer stores a color value which is written to the pixel position if the pixel position is enabled by the control signal. Nothing is written to a pixel position which is not enabled. This block mode of operation allows simultaneous writes of the single color stored in the color register to a number of pixel positions equal to the number of conductors on the data bus. This mode may also be used to clip pixel data to a window on the display by writing a color value within the window and ignoring the pixels outside the window area.

Using this block mode of operation with a color value register speeds up writing to a frame buffer under many of the conditions in which lack of speed is most obvious. Unfortunately, this mode of operation has a number of limitations. First, it has been typically used with systems using four bit color pixels. Second, it has never been adapted for use with more that one color pixel size as might occur in modern color systems. More importantly, typical operations which are accomplished with the data in any window of the display involve a manipulation of only two colors. For example, when text is written to the screen, the color of each letter and the color of the background surrounding that letter are manipulated by varying the pixels stored in the frame buffer for describing the image on the display. Unless both colors are written, no outline is provided for the text. Both the software which provides data for display and the various graphical rendering devices which accelerate the manipulation of that data are capable of manipulating two colors at once and usually do so. However, the frame buffers which are available for desktop computers are capable of varying no more than a single color at a time in the block mode in which a number of pixels may be addressed simultaneously. Thus, though the modern rendering devices speed up the manipulation of data, the presentation slows at the frame buffer which is able to accept only a single color at a time when presented data in the block mode of operation. This problem is especially acute because each time a different color is used for a group of pixels, the color register must be updated from the old color value to the new color value in a time consuming operation before the new color may be used. Thus, a background color must be first placed in the color value register in one operation for a first row on the display. The pixels of that color must be written to the frame buffer. Then, the color must be changed in the register, and those pixels of the foreground color described in a second write operation. When, the next row of pixels is written to the frame buffer, the entire operation must be repeated again. The need to repeat the same operation for each row of the frame buffer greatly slows the speed at which pixel data may be written.

Recently, an arrangement has been devised which allows two colors to be written simultaneously in a block mode write operation. The arrangement uses a plurality of color value registers on the frame buffer to store a plurality of color values. This arrangement eliminates the necessity to reload the color value registers during the writing of a window, allows multiple color modes to be utilized, and accelerates writing dramatically. The arrangement is described in detail in copending U.S. patent application Ser. No. 08/145,756, entitled *Apparatus For Providing Fast Multi-Color Storage In A Frame Buffer*, Priem et al, filed on even date herewith. It is desirable to provide apparatus and methods for utilizing the arrangement described in the co-pending patent application to most effectively speed the operation of writing to a frame buffer.

SUMMARY OF THE INVENTION

It is, therefore, an object of the present invention to provide a new design of frame buffer capable of rapidly handling in large blocks the data transferred to it for display.

It is another more specific object of the present invention to provide a new design of frame buffer capable of speeding the display of data by factors which are the order of magnitude of the prior art frame buffers.

These and other objects of the present invention are realized in a frame buffer having a memory array, circuitry for accessing the array, a plurality of color value registers for storing a plurality of color values which may be written to the array, and circuitry for writing simultaneously to the memory cells representing an entire row of pixels of the array in selected color modes and to selected adjacent groups of pixels whereby an entire row of a window may be written in a minimum number of accesses.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art, The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
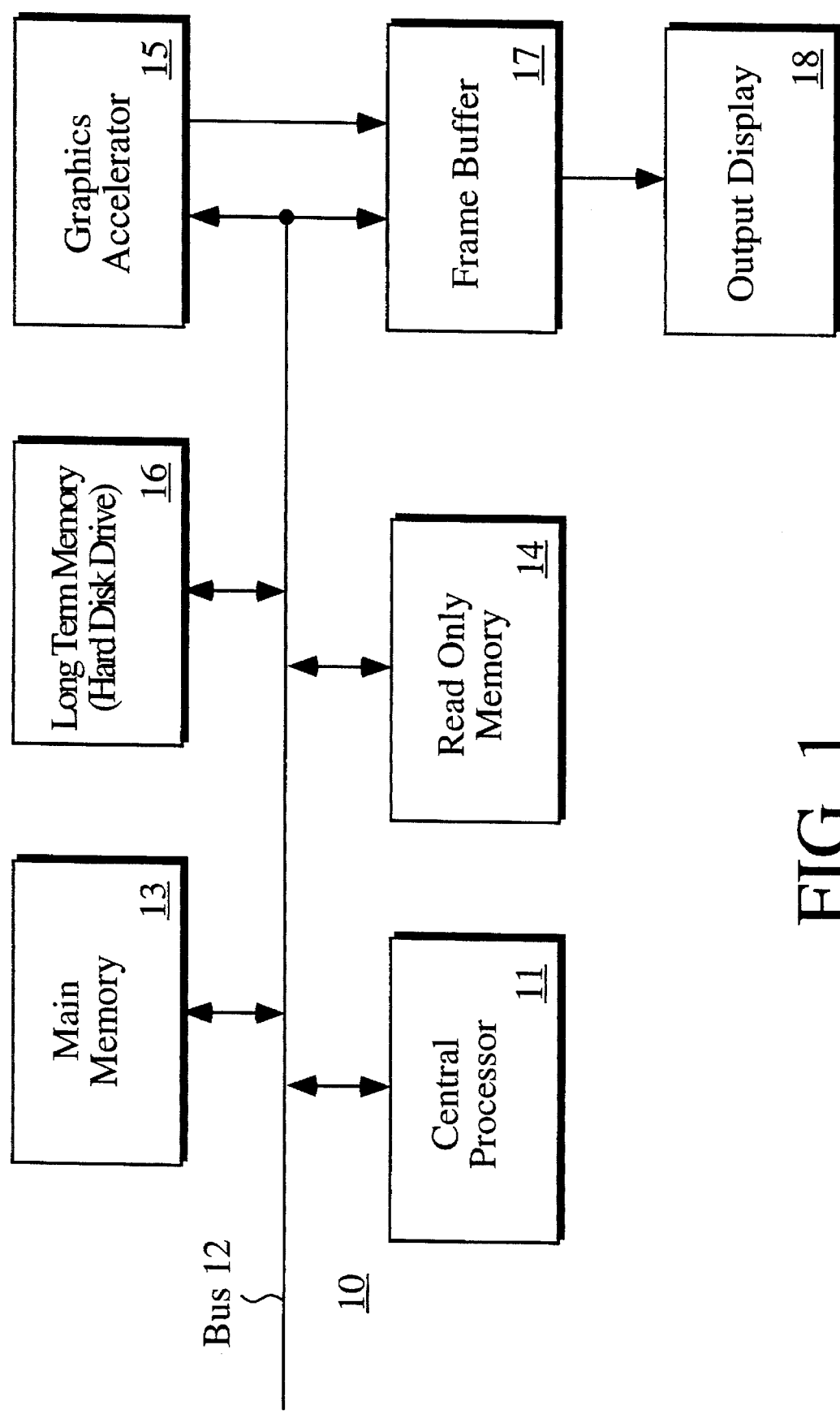
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. For the purpose of this description, the bus 12 may be considered to represent both a data bus and an address bus. Also connected to the bus 12 is main memory 13 which is typically constructed of dynamic random access memory arranged in a manner well known to those skilled in the prior art to store information being used by the central processor during the period in which power is provided to the system 10. A read only memory 14 which may include various memory devices (such as electrically programmable read only memory devices (EPROM devices)) well known to those skilled in the art which are adapted to retain a memory condition in the absence of power to the system 10 is also connected to provide information on the bus 12. The read only memory 14 typically stores various basic functions used by the processor 11 such as basic input/output and startup processes.

Also connected to the bus 12 are various peripheral components such as long term memory 16. The construction and operation of long term memory 16 (typically electromechanical hard disk drives) are well known to those skilled in the art. A frame buffer 17 is also coupled to the bus 12. The frame buffer 17 stores data which is to be transferred to an output device such as a monitor 18 to define pixel positions on the output device. For the purposes of the present explanation, the frame buffer 17 may be considered to include in addition to various planes of memory cells necessary to store information, various circuitry well known to those skilled in the art such as addressing circuitry, sensing amplifiers, color lookup tables (where color indexing is utilized), digital-to-analog converter circuitry, and circuitry for controlling the scan of information to the output display. In FIG. 1, the frame buffer 17 is illustrated as coupled to the bus 12 through circuitry such as graphic accelerating circuit 15 used for providing fast rendering of graphical data to be furnished to the frame buffer 17. The graphic accelerating circuit 15 typically relieves the central processor of a number of time consuming operations so that the computer system may operate more rapidly.

Figure 2:
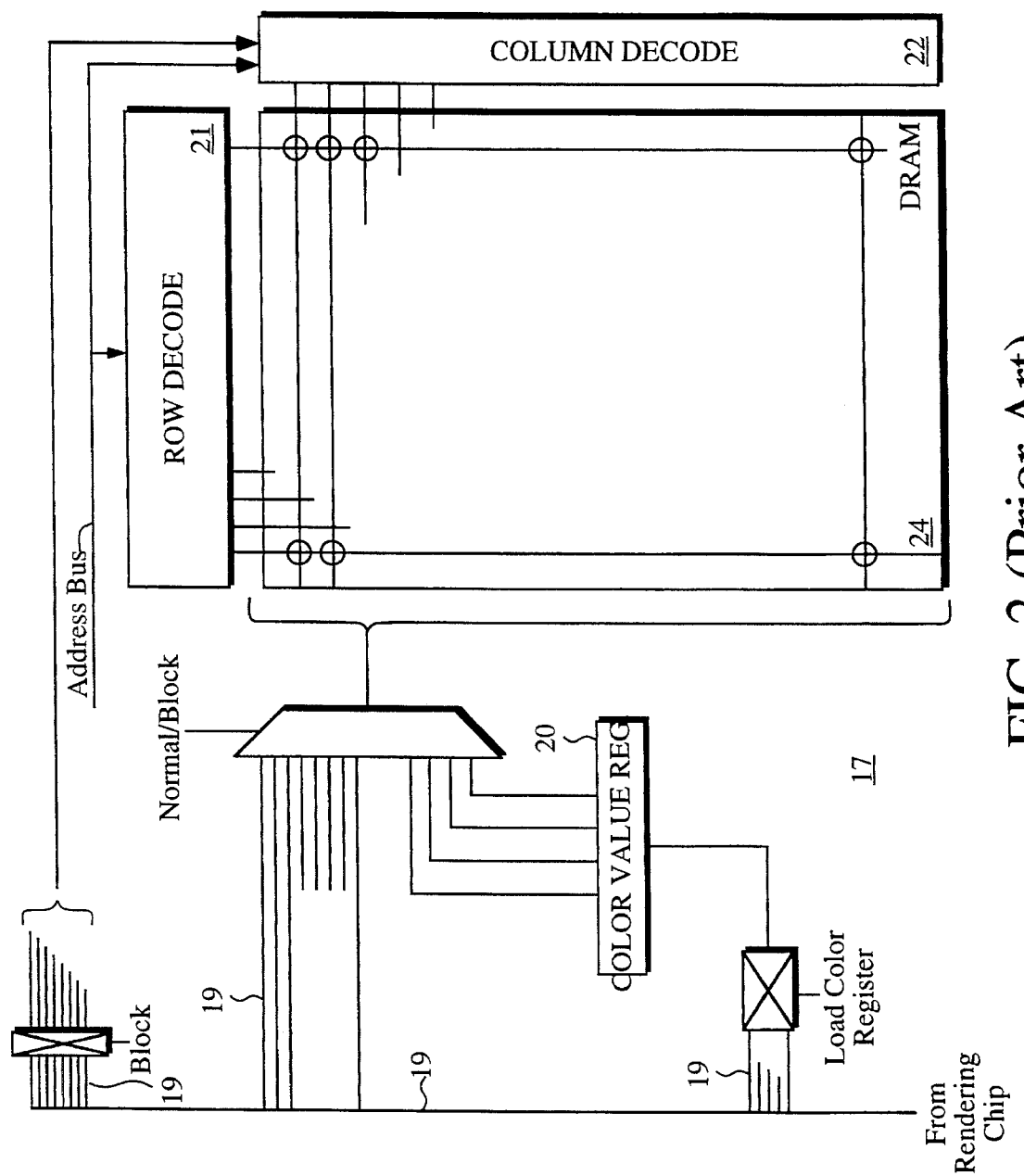
FIG. 2 is a block diagram illustrating a frame buffer designed in accordance with the prior art.

FIG. 2 illustrates a frame buffer 17 constructed in accordance with the prior art. Typically such a frame buffer includes a dynamic random access memory array 24 designed to store the information defining pixels on the output display. As outlined above, when a random access memory used as a frame buffer 17 is accessed in its normal mode of operation, data is written to or read from the frame buffer 17 on the conductors of a data bus 19. When the frame buffer 17 is written, all of the data conductors transfer data in a binary pattern. In a typical computer system having a thirty-two bit data bus 19, thirty-two bits of information may be written to the frame buffer memory and appear at thirty-two input pins. This data may define one or more pixels depending upon the number of bits required to define a pixel in the particular color mode of operation. For example, if the mode of operation is eight bit color, then each pixel displayed requires eight bits of data; and thirty-two bits of data on the data conductors are capable of defining four pixels in each write access. This is a relatively slow method of filling the frame buffer with pixel data to be written to the display. This is, however, the typical method (normal mode) of writing to a frame buffer. It is used for most user entries of data where the speed of writing to the frame buffer is not limiting. It is also used in other instances where a window contains more than two different colors for manipulating large numbers of pixels, such as when a paint file containing a multicolored image is first opened or is moved on the display.

There are many operations which affect the display, however, which manipulate very large numbers of pixels and do not require that pixels be individually written with different color values. These operations include, for example, clearing the entire display or a window of the display, writing a file to a window, and similar operations. Because filling the frame buffer (or a portion thereof) is so slow when each pixel (or two, or four) is individually written to the frame buffer using the data conductors as in the normal mode of writing, some frame buffers also have circuitry which allows a mode of operation (referred to as block mode) in which each of the data conductors controls access to all of the bits representing a pixel. This block mode has been used in the prior art with frame buffer arrays in which each pixel is represented by four bits allowing sixteen different colors to be described. The mode allows a single color value stored in a register to be written to a plurality of individual pixel positions in the frame buffer memory simultaneously. In this block write mode, the information written to the array on the data conductors is used to enable writing to the memory positions representing particular pixel positions. The color value is stored in a color value register on the frame buffer and written to the enabled positions. This allows a number of pixels up to the number of data conductors on the data bus to be written with a single color simultaneously.

FIG. 2 shows a frame buffer 17, a data bus 19 having a plurality of data input conductors, and a color register 20. A four bit color value to be stored as pixel data in memory cells in the memory array 24 is written into the color register 20 on the conductors of the data bus 19. An address furnished on an address bus to row decode circuitry 21 and column decode circuitry 22 selects the particular group of pixels to be written. In the block write mode, data transferred to the frame buffer 17 on the data conductors of the data bus 19 indicates the positions of pixels which are to be written. These control signals on the data conductors are transferred to the column decode circuitry 22 to enable the selected ones of the addressed pixel positions. If a particular data conductor of the data bus 19 carries a zero value, then the particular pixel position is not written. If a data conductor of the data bus 19 carries a one value, then the four bit color value from the color register 20 is written into the pixel position. In this way, selected ones of a number of individual pixels may be written at once using the color value stored in the color value register 20. This is a very useful manipulation if it is desired to accomplish manipulation of large areas using the same color. For example, with a thirty-two bit data bus, one may rapidly clear a window by writing a background color to the entire window of a display in accesses of thirty-two pixels at a time. This mode also allows pixel data to be clipped to fit within a window. This may be accomplished by enabling pixel position for writing a color within the window while disabling pixel positions outside the window. The block mode is especially useful when four bit color pixels are used to display images on an output display device. The block mode, however, has not been adapted by the prior art for use with more advanced color systems. For example, no arrangement has been suggested by which block writes may be accomplished for a plurality of different sized color pixels.

A more major problem with this prior art block mode of operation is that the frame buffer is only capable of dealing with one color at a time although more than one pixel may be written simultaneously with that one color. As pointed out, a window uses two colors to display any typical application. The graphical accelerating devices and software which furnish pixel information to the frame buffer 17 typically manipulate two colors at once in order to enhance the speed of operation of the display. Although the block mode of operation was devised specifically to increase the speed at which pixel data is written to the display, this mode is capable of affecting only one color at once. Consequently, while an entire screen may be cleared rapidly using this block mode, more advanced manipulations slow down the system operation. For example, when any information is written to the frame buffer using the block mode, a first background color must first be placed in the color value register; and the entire first row of the particular window must be then cleared by writing the background color in groups of pixels equal to the bus width. Then the foreground color (typically carrying the information) is placed in the color value register, and the foreground pixels are written to the row in the same manner. Then the background color is again placed in the color register, and the entire second row of the particular window is cleared. The background color is then replaced in the color register with the foreground color, and the foreground pixels are written for the second row. This continues until all of the rows of the window have been written. This is a time consuming operation but faster than individually writing each of the positions representing the pixels as in the normal mode. A major reason why it is so slow is the necessity to constantly reload the color register with the foreground and background colors used in each row of the display.

Figure 3A:
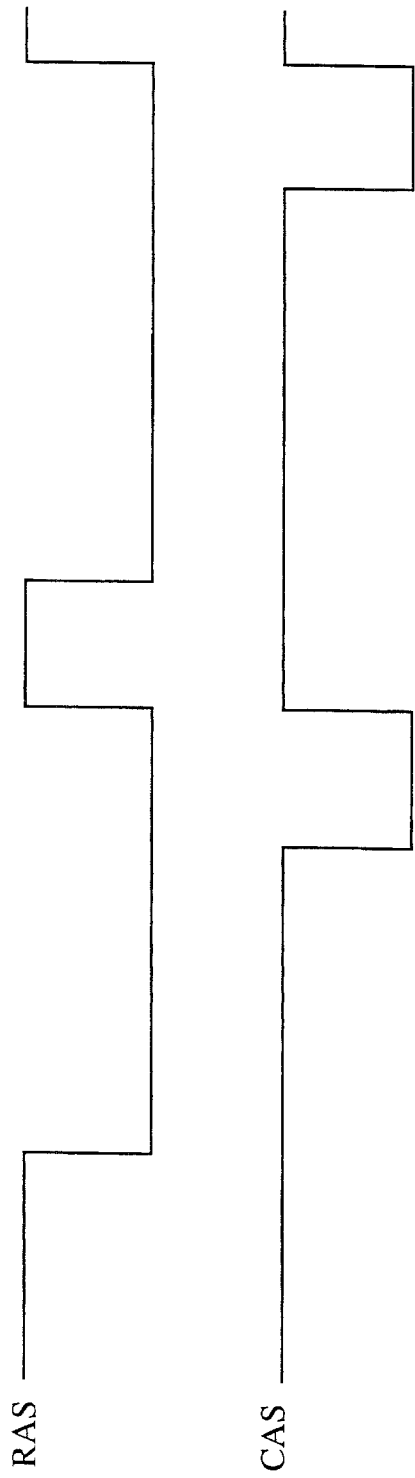
FIG. 3 is a timing diagram illustrating the operation of the prior art frame buffer in FIG. 2.
Figure 3B:
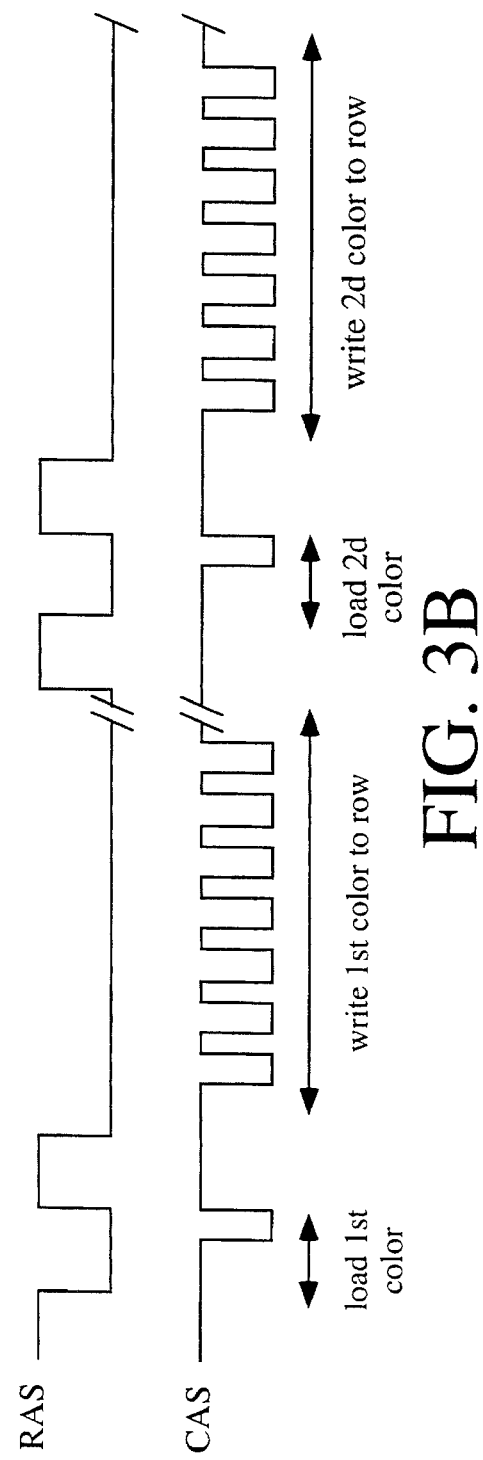

FIG. 3 is a timing diagram illustrating the operation of the prior art frame buffer of FIG. 2. In prior art frame buffers, each access of the frame buffer requires that both a row address strobe (RAS) cycle which typically requires 120 nanoseconds and a column address strobe (CAS) cycle which typically requires 20 nanoseconds be accomplished. Typically data is furnished to the array on the falling edge of the CAS cycle. These strobe cycles are illustrated in the upper two lines of the figure. A first column address strobe cycle may overlap the row address strobe so that the total time for any individual access requiring only a single column address strobe cycle is 120 nanoseconds.

These two strobe cycles are required not only for accessing the memory positions in the frame buffer but also for all other accesses of the frame buffer such as for loading the color value register. Consequently, to write two colors to thirty-two pixel positions using the block write mode requires a number of time consuming steps. The lower two lines of FIG. 3 illustrate such steps. To load the color register with background color typically requires a first combined RAS/CAS access of 120 nanoseconds. This must then be followed by a second combined RAS/CAS cycle of 120 nanoseconds to write the background color stored in the color register to the thirty-two pixels. Reloading the color register with foreground color takes another 120 nanoseconds, and writing the foreground color takes another 120 nanoseconds. Thus, the entire operation to write thirty-two pixels requires 480 ns. or approximately 16 ns./pixel. Of course, when an entire row is written, the per pixel time to write using block write mode is shortened because the color value register need only be loaded twice for each row and each group of thirty-two pixels of the same color in the same row requires only 20 additional nanoseconds. Since writing a row requires only 20 additional nanoseconds for each thirty-two pixels written with each color, approximately 1240 ns. more time is required to write a row of 1024 pixels once the color has been loaded. Thus, the time necessary to reload the color register twice on each row (including the RAS/CAS cycle necessary to indicate the end of the load operation) and the requirement to write twice to each thirty-two-bit position in each row slow the operation significantly.

It has now been found possible to extend the prior art block write operations described above to function with more advanced color modes using eight, sixteen, and thirty-two bit to represent color values. Moreover, it has been discovered that by providing an improved frame buffer memory which includes more than one color value register and which is, thus, capable of handling a plurality of colors simultaneously during accesses involving data representing a plurality of pixels, many of the operations of a frame buffer which handle large numbers of pixels may be dramatically accelerated. The improved frame buffer memory by having a plurality of color value registers allows color values to be written to pixel positions without the need to reload color registers. By so doing, the improved frame buffer eliminates the need to reload the color register twice for each row of a window to be written. In fact, the improved frame buffer allows the color registers to be written at any time during the operation and eliminates any real need to rewrite those registers during the time a window is being written. By having more than one color available, two colors may be written at once as foreground and background colors in portions of the window which require no clipping. The use of at least two color registers significantly increases the speed at which large blocks of pixel data may be loaded into a frame buffer. Such an improved frame buffer is described in detail in the U.S. patent application Ser. No. 08/145,756, entitled *Apparatus For Providing Fast Multi-Color Storage In A Frame Buffer*, referred to above.

The present invention provides apparatus and methods for accelerating the operation of the frame buffer even further through the use of a number of additional modes for writing to the frame buffer. These modes of operation may be combined to greatly enhance system operation.

Figure 4:
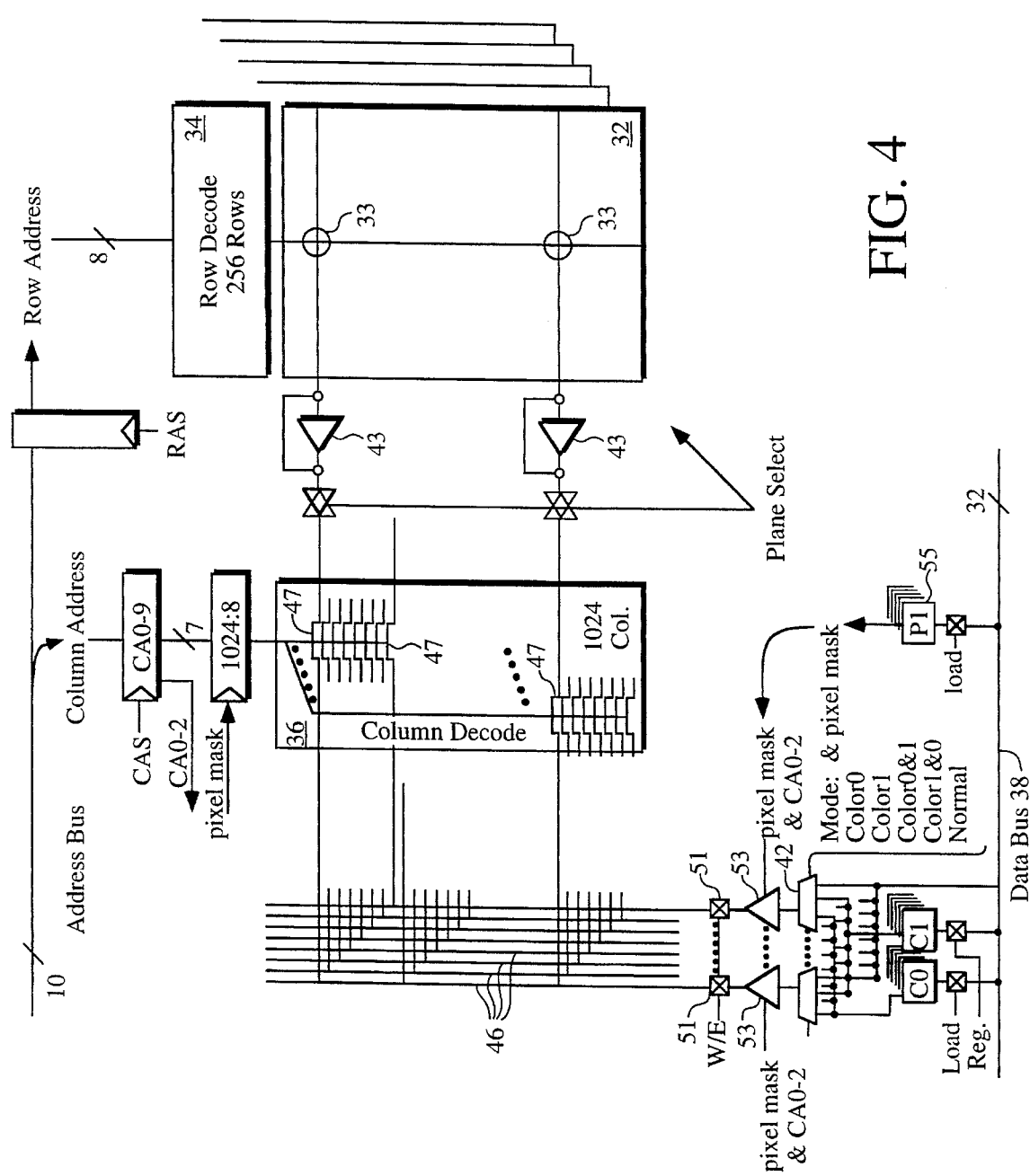
FIG. 4 is a block diagram illustrating the a circuit arrangement in accordance with the invention.

Referring now to FIG. 4, there is illustrated a diagram useful in understanding the invention. FIG. 4 illustrates a circuit board upon which reside the various components of a frame buffer 30. The frame buffer 30 includes a plurality of memory cells which may include devices such as field effect transistor devices arranged to provide dynamic random access memory array 32. The arrangement of the cells constituting the array 32 is developed in accordance with principals well known to those skilled in the art. It is adapted to provide a sufficient number of addressable memory cells to describe the number of pixels to be presented on an output display device in a particular mode of operation. For example, such an array 32 might include thirty-two planes (only the first is illustrated in detail), each plane including 256 rows, each row including 1024 memory cells; such an arrangement would allow the storage of color data sufficient to display thirty-two bit color in a 512×512 mode on a color output display terminal.

In addition to the array 32, the frame buffer 30 includes row and column decode circuitry 34 and 36 for decoding the addresses furnished by a controller such as a central processor and selecting individual cells 33 in each plane of the array 32 to define the various pixels which may be represented on an output display device. Also included as a part of the frame buffer 30 are data conductors 38 which may be a portion of a data bus adapted to provide data to be utilized in the array 32. Typically, thirty-two data conductors 38 are provided although this number will vary with the particular computer system.

When data is written to the frame buffer 30 on the data bus in the normal mode of operation, each group of thirty-two bits will define one or more color values to be displayed at one or more pixel positions on the output display. Thus, when an output display is displaying data in an eight bit color mode, the thirty-two bits carried by the data conductors 38 may define four pixel positions on the display in normal write mode. On the other hand, when a display is displaying data in a thirty-two bit color mode, the thirty-two bits of the data conductors 38 carry information defining a single pixel position on the display. As may be seen, one of the data conductors 38 of the bus is connected to all of eight multiplexors 42 in each plane of the array so that the data bit carried by that conductor 38 may be placed in the appropriate memory cell of the plane of the array 39. Each of the multiplexors 42 selects the source of the data to be transferred to the array 32 in each plane depending on the mode of operation selected. Thus, if the mode is normal, then the data bit is selected directly from the data conductor 38 for that plane of the array. The bit is transferred to the particular column selected and written to that column and the selected row. Since a bit may be written in each of thirty-two planes of the array, thirty-two bits may be written from the bus conductors 38 (one to each plane) as one thirty-two bit pixel, two sixteen bit pixels, or four eight bit pixels, depending on the mode of color operation.

The embodiment illustrated in FIG. 4 is the preferred embodiment of the invention which is particularly adapted to be used in a system utilizing eight bit color modes. As will be seen, the system is adapted to provide certain special modes for eight bit color operations. As will be explained, addition special modes for each of sixteen and thirty-two bit color modes may be provided by simple modifications as is explained herein. To this end, the system utilizes eight individual multiplexors 42 in each plane of the frame buffer 30 for selecting particular write input data. Each of these multiplexors 42 has its output connected to one of eight tri-state write drivers 53 which furnishes an output signal via a switch such as a transmission gate 51 on a conductor connected to every eighth column of the particular plane of the array. A system adapted to provide special modes for sixteen bit color as well as eight bit color would utilize sixteen individual multiplexors 42, sixteen drivers 53, sixteen gates 51, and would connect to columns of the array in groups of sixteen. Similarly, a system adapted to provide special modes for thirty-two bit color as well as eight and sixteen bit color would utilize thirty-two of each of these components.

The frame buffer 30 also includes a pair of color value registers C0 and C1 which are utilized to store color values which may be utilized in block modes of operation described hereinafter in which a plurality of storage positions may be written simultaneously. Each plane of the array includes a one bit register C0 and a one bit register C1 for storing one bit of a color value stored in the color register. Since each plane includes one bit for each register, each register includes a total of thirty-two bits in this embodiment. Thus an entire eight bit color value may be stored in the registers C0 and C1 residing on eight planes, an entire sixteen bit color value may be stored in the registers C0 and C1 residing on sixteen planes, and an entire thirty-two bit color value may be stored in the registers C0 and C1 of thirty-two planes of the frame buffer 30. With a thirty-two bit color register such as is shown, the color pattern for a particular eight bit color value may be repeated four times in each color register (similarly a sixteen bit color value may be repeated twice). The color registers C0 and C1 may be selectively addressed so that they may be loaded by data furnished on the conductors 38 of the data bus; as may be seen, switches are provided in each cell plane to allow loading of the registers C0 and C1 with data from the data conductors 38 in response to load control signals. Thus, the multiplexors 42 may select as color values to be written not only the data values carried by the conductors 38 but also the values stored in the color registers C0 and C1. The selection depends on the particular color mode of operation, a value indicated by control signals furnished by the central processor or by the graphical accelerating device.

In the normal write mode of operation, a particular address is transferred on the address bus to select a particular row and column. This address on the address bus at the falling edge of the RAS signal selects a particular row and causes all of the memory cells 33 of that row in each plane of the array selected to be connected to sense amplifiers 43 in each column. This operation causes the sense amplifiers 43 to refresh each memory cell in the selected row. At the falling edge of the CAS signal, the column address applied to the appropriate switch 47 of the column decode circuitry 37 selects the appropriate column in each plane to be written. In the preferred embodiment of the invention, the column address is ten bits. Of these, the higher valued seven bits CA3-9 of the ten bit column address are used to select a group of eight adjacent columns. The normal write mode control signal at each of the multiplexors 42 causes the data signal on the particular conductor 38 associated with that plane to be transferred by each of the eight multiplexors 42. One of the signals produced by the multiplexors 42 is amplified by a single one of the amplifiers 53 and transferred to the addressed memory cell 33 in that plane of the array. The lower three bits CA0-2 of the column address signal select the particular one of the amplifiers 53 which transfers the data bit to a single one of the columns. Since each of the conductors 38 carries an individual bit for the memory cell at the selected row and column, the pixel value (or values) will be transferred to the appropriate column and row position in each plane of the array.

When a block mode of operation is indicated by the control signals, the data conductors 38, rather than carrying pixel data, carry enabling signals to indicate pixel positions in the array 32 to which the color values held in the registers C0 and C1 are to be written. These color values are loaded from the data conductors 38 of each array plane of the frame buffer 30 in response to a load color register control signal. Since two color registers C0 and C1 are provided in the preferred embodiment, a total of four color modes of operation are possible. These modes are referred to as color 0 mode, color 1 mode, color 0&1 mode, and color 1&0 mode.

In the color 0 mode of operation, if a control signal value of one is transferred on a particular data conductor 38, then the value in the color register C0 is written to the storage positions which define the pixel addressed for that conductor 38. The value in the color register C0 is also transferred to all other storage positions at addresses to which one control values are transferred on the data conductors 38. On the other hand, no color value is written to the pixel positions to which a zero control value is transferred on a data conductor 38. Thus, thirty-two different pixel positions may be affected in a single simultaneous transfer; those positions which receive a one value are enabled to receive the value in the color register C0 while those which receive a zero value remain unchanged. As may be seen, the arrangement is adapted to function with each of eight, sixteen, and thirty-two bit color pixels.

The manner in which this is accomplished will be illustrated in a case of eight bit color referred to as block 8 mode.

It should be noted that block eight refers to the number of bits in each pixel while color 0 refers to the manner of selecting a particular one of the colors in a color value register. Presuming that the color value register C0 has been loaded with a pattern of eight bits which is repeated four times in the thirty-two bits provided in that register C0 and that the color value register C1 has been loaded with another pattern of eight bits which is repeated four times in the thirty-two bits provided in that register C1, then a row and eight columns are selected in each of the planes of the array by the address on the address bus through the row and column address decode circuitry 34 and 36 in the manner described above. Assuming that color mode 0 is selected, all eight of the multiplexors 42 on each plane select the register C0 as the source of color data for the array. Then the particular write drivers 53 are enabled in accordance with the enabling signals appearing on the conductors 38 of the data bus.

Figure 5:
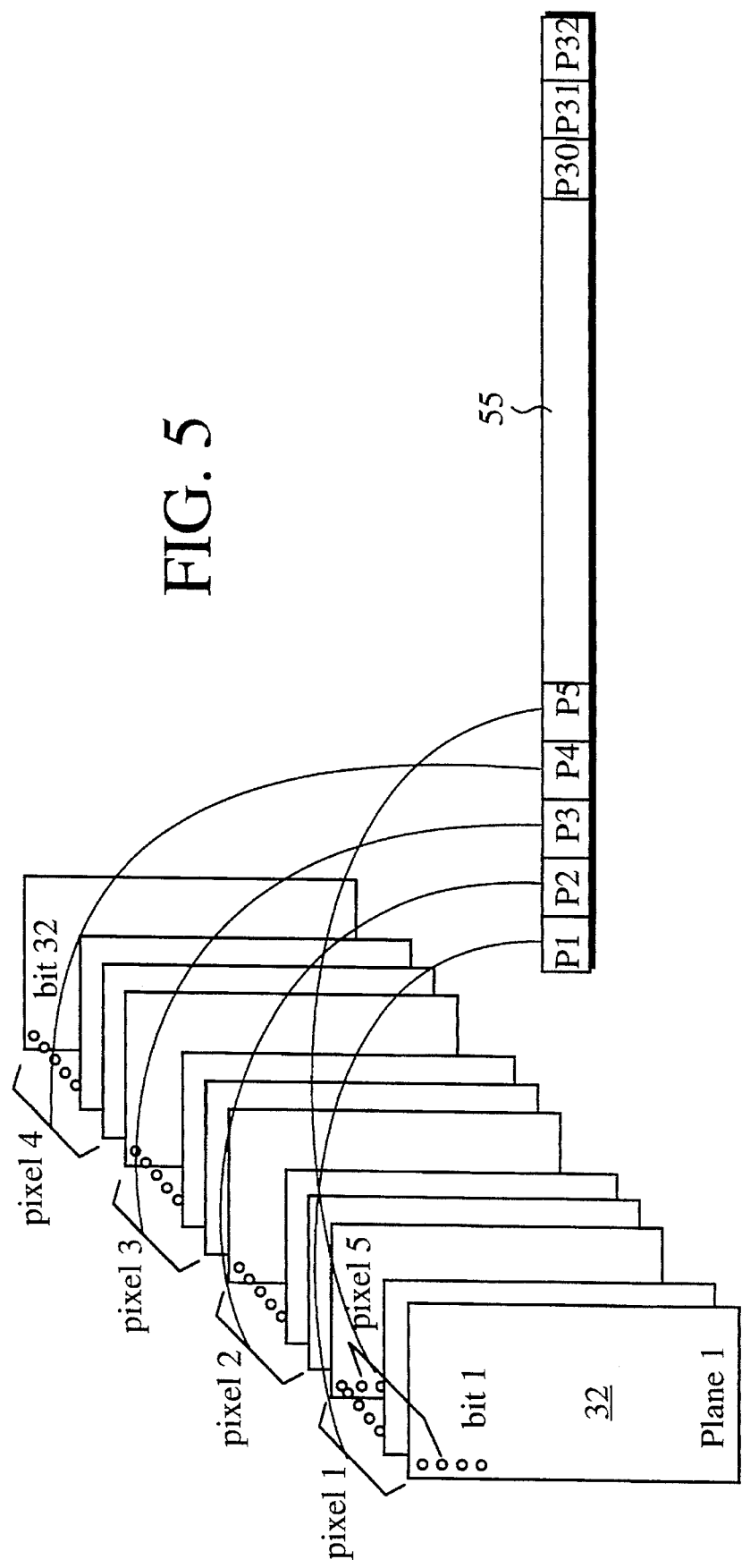
FIG. 5 is a diagram illustrating the accessing the array in modes capable of affecting a number of pixels simultaneously.

The data appearing on the conductors 38 is sent to a pixel mask register 55. The pixel mask register is used to control all of the drivers 53 controlling transfer of data to a particular pixel. The manner in which this is accomplished is illustrated in FIG. 5. Since the example considered involves eight bit color and assuming that the first eight columns have been selected by the column address, the bits defining the first pixel lie in the first column in the selected row and the first eight planes of that column. The first pixel P1 in the pixel mask register 55 controls the drivers 53 to transfer the color to these bit positions in the array from the color value register C0. Presuming that the second one of the conductors 38 carries a zero value and that this value is stored in the pixel mask register 55, the drivers 53 connected to the bit positions lying in the next eight planes of column 0 are disabled so that the value in the color value register C0 is not transferred to these bit positions. The control of the other bit positions occurs in a similar manner as is illustrated in FIG. 5. Consequently, with one row and eight columns selected, a number of pixels selected by one values on the data conductors 38 up to a total of thirty-two eight bit color pixels may be written simultaneously with the value stored in the color value register C0.

This mode is a fast mode of operation similar to the block mode used in prior art frame buffers and may be used to clear the screen very rapidly or to otherwise provide a single color to the window area. For example, a frame buffer 30 for a display which is 1024×780 pixels and eight bits deep, may be cleared approximately thirty-two times faster than individual pixels may be written one by one to the frame buffer 30. This mode is also useful for clipping since a color value may be written to pixel positions inside a window area and the pixel positions outside that area ignored.

Color 1 mode is similar to color 0 mode except that if a one value is transferred on a particular data conductor 38, then the value in the color register C1 is written to the storage positions which define the pixel addressed for that conductor 38. The value in the color register C1 is also transferred to all other storage positions at addresses enabled by one values transferred on the data conductors 38. On the other hand, no color value is written to the pixel positions to which a zero is transferred on the data conductors. Again, thirty-two different pixel positions may be affected in a single simultaneous transfer; those positions which receive a one value are enabled to receive the value in the color register C1 while those which receive a zero value remain unchanged. The method of writing the data from the color register C1 is essentially the same as that explained with regard to Color register C0 and will be understood by reviewing FIG. 5.

As may be seen, since the two color registers C0 and C1 may be loaded prior to manipulating any portion of a window and are always available, a series of pixels (e.g., thirty-two) may be written in two accesses without any need to reload color registers. Background color may be written in a first access and foreground color written in a second access. As will be understood, this allows both clipping and two colors to be written to an edge of a window in two accesses since clipped portions may be ignored while a first color is written to some positions within a window area and then the same clipped portions may be ignored again while a second color is written to other positions within the window area.

However, even faster writing is possible using the color modes 0&1 and 1&0 in those portions of the display in which clipping is unnecessary. As was pointed out above, most operations involved in writing to the display utilize two colors.

Typically, a rendering chip (graphics accelerator) or the central processing unit provides a control signal indicating where clipping is necessary. In the absence of this signal, use of the color mode 0&1 allows two colors to be written simultaneously to the frame buffer. In this mode, a zero value on a data conductor 38 indicates that a color value is to be written to the controlled pixels from the color value register C0 while a one value on a data conductor 38 indicates that a color value is to be written to the controlled pixels from the color value register C1.

The selection of the color value for each pixel is accomplished by combining the control value transferred on the data conductor 34 for each plane and stored in the pixel mask register 55 with the color mode control signal to select the particular color register from which the color value is transferred by the multiplexors 42. For example, when in color mode 0&1, a zero in a bit position in the pixel mask register 55 causes a multiplexor 42 to select the color value stored in the color value register C0 while a one in a bit position in the pixel mask register 55 causes a multiplexor 42 to select the color value stored in the color value register C1. Then, the color mode control signal indicating mode 0&1 controls all of the drivers 53 to write the pixels selected to the array. This allows two separate colors representing both foreground and background to be written simultaneously to those portions of a window area which do not require clipping. In a similar manner, the color 1&0 mode allows the two colors in the registers C0 and C1 to be simultaneously written to the array but to opposite positions, a zero now causing the multiplexors 42 to select register C1 while a one causes the selection of register C0.

Having at least two color value registers thus eliminates the necessity of changing color values in a color register and also eliminates the need to write foreground and background colors to the frame buffer in separate operations for the pixel positions designated on the data conductors.

Figure 8:
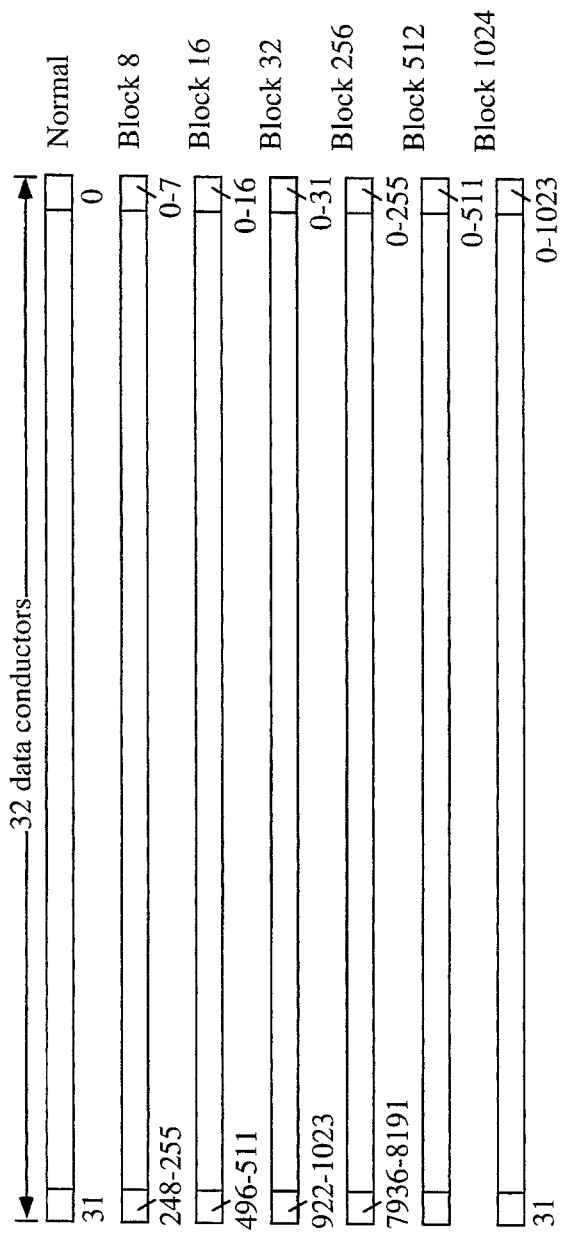
FIG. 8 is a diagram illustrating various modes of operation used in carrying out the invention.

The present invention adds to the invention of the copending patent application by providing a plurality of different modes by which the frame buffer may be written. In each of the writing modes every bit on the data conductors affects a different number of bits in the frame buffer. FIG. 8 illustrates the different modes and shows the number of bits affected by the condition of each bit transferred on the conductors of the data bus in each of these modes of operation. These different writing modes provide different degrees of resolution and thus of control over the area written.

The first mode is the normal mode of operation described above in which each data conductor affects a single bit stored in the frame buffer. This mode is used for the operations which require writing to the display a pixel at a time. This mode allows any color to be written to a pixel position. This mode is, of course, the conventional slow normal mode used by prior art frame buffers which requires 120 ns. for each pixel written.

A second mode of operation is the block 8 mode described above in which the value transferred on each data conductor 38 is used as an enabling signal which affects eight bits stored in the frame buffer. This mode is used for write operations with programs which utilize eight bit color. It allows as many eight bit pixels to be written simultaneously as there are data conductors; in the exemplary system, thirty-two pixels may be written in a single access. Utilizing the two color registers illustrated in FIG. 4, any of the four color modes of operation are possible in this mode. Thus, certain pixels may be enabled to be written with one color value from one of the color value registers (or another color from the other register) while other pixels are ignored using color 0 and color 1 modes. Moreover, as explained above, all of the pixels affected by the data conductors may be written simultaneously with two distinct colors held in the two color value registers using color 0&1 and color 1&0 modes.

In a third mode of operation referred to as block 16 mode, each data conductor affects sixteen bits stored in the frame buffer. In this mode, the number of individual multiplexors 42 on each plane is increased from eight to at least sixteen. Similarly, the number of columns which may be selected simultaneously by the column address is increased to allow the selection of sixteen columns simultaneously. By making these changes and providing signals to allow a total of thirty-two pixels of sixteen bits each to be written from the color register, a block 16 mode is provided which is similar to the block eight mode and is used for the operations with programs which utilize sixteen bit color. It allows as many sixteen bit pixels to be written simultaneously as there are data conductors; in the exemplary system, thirty-two sixteen bit pixels may be written in a single access. Utilizing the two color value registers illustrated, any of the four color modes of operation are possible in this mode. Thus, certain sixteen bit pixels may be enabled to be written with one color (or another color) while other pixels are ignored. Moreover, all of the pixels affected by the data conductors may be written simultaneously with two distinct colors held in the two color value registers.

In a fourth mode of operation referred to as block 32 mode, each data conductor affects thirty-two bits stored in the frame buffer. In this mode, the number of individual multiplexors 42 on each plane is increased from eight to at least thirty-two, the number of columns which may be selected simultaneously by the column address is increased to allow the selection of thirty-two columns simultaneously, and the control signals are modified to accommodate these changes. This mode is also similar to the block eight mode and is used for the operations with programs which utilize thirty-two bit color. It allows as many thirty-two bit pixels to be written simultaneously as there are data conductors; in the exemplary system, thirty-two thirty-two bit pixels may be written in a single access. Utilizing the two color registers illustrated, any of the four color modes of operation are possible in this mode of writing. Thus, certain pixels may be enabled to be written with one color (or another color) while other pixels are ignored. Moreover, all of the pixels affected by the data conductors may be written simultaneously with two distinct colors held in the two color value registers.

Figure 6:
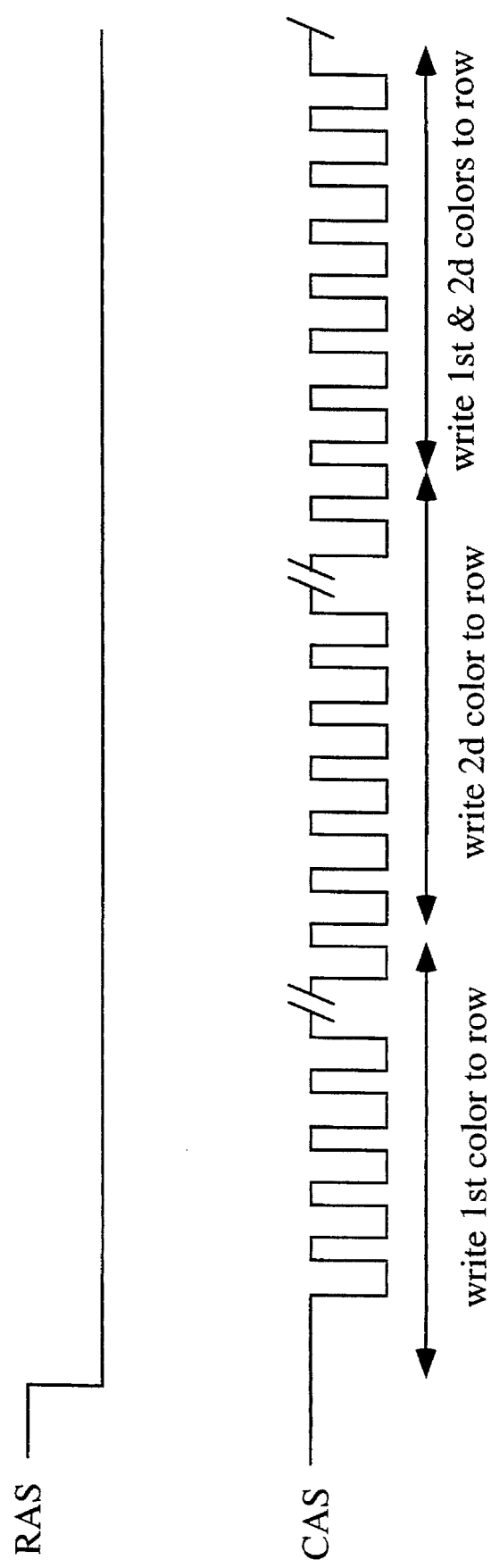
FIG. 6 is a timing diagram illustrating signals furnished during the operation of the invention.

As will be understood by those skilled in the art, the block eight, sixteen, and thirty-two modes of operations are devised to allow very fast writing of pixels to the frame buffer (approximately thirty-two times as fast as normal mode operations) in groups equal to the number of data conductors in either one or two colors. Moreover, since all of the different color modes may be used with each of these write modes, each of these writing modes may be used to clip pixel data to a window. For example, by setting the data on the data conductors controlling pixels to the left of a window to zeroes and those inside a window area to ones in color zero mode during an access which crosses a window boundary, a background color may be placed in pixel positions within a window at the edge of a window in a row. Then by repeating the access but writing the foreground pixels inside the window area with the foreground color value by setting the data on the data conductors to one using color one mode while again setting the data value to zero for the pixels outside the window boundary, the portion of the row for the access is completed. This is illustrated in FIG. 6 which shows the various accesses necessary for a single row.

Once the left edge of the window has been completed, the center of the window may be completed in a series of accesses each of which writes thirty-two pixels simultaneously, each pixel being written in one of the two color values. Finally, the other edge of the row containing the window crossing is completed using two accesses to write background and foreground colors in a manner essentially similar to that used for writing the left edge of the window.

Those skilled in the art will understand that this selection of modes greatly enhances the speed with which the movement of large blocks may be accomplished in a frame buffer. For example, none of the accesses necessary to rewrite color registers are required. This eliminates at least two 120 nanosecond accesses in writing each line of a window. Moreover, since the central portion of the display is written in modes in which two colors are written simultaneously, only half as many accesses and half the time are required as to write prior art frame buffers. Consequently, as illustrated by the timing diagram of FIG. 6, these different block write modes with color 0&1 and 1&0 modes allows a 1024 pixels row to be written in a series of thirty-two pixels accesses which requires a single RAS signal and one GAS signals for each thirty-two pixels in the row. To write to the largest window in such a row requires at most 780 ns.

It should be noted that additional speed is acquired by providing block write modes each of which allows a single entire pixel to be written under control of a single data conductor. The ability to affect a selected number of bits equal to each of the values used for a pixel allows a substantial increase in speed of operation over that of prior art arrangements. Rather than having to fill the bits of a pixel at a single fixed rate (such as four bits for each data conductor per access) as in the prior art and thus taking a number of data conductors to complete pixels of eight, sixteen, and thirty-two bits, each pixel is completed with each access. It will be recognized that a single frame buffer can be configured as an eight bit frame buffer, a sixteen bit frame buffer, or a thirty-two bit frame buffer to work with the software of an application program.

Three additional modes of write access are provided by the present invention which further increase the speed of operation of the frame buffer. A first of these modes is referred to as block 256 mode. In block 256 mode, the value on each data conductor determines the color value written to thirty-two adjacent eight bit pixel positions. This is accomplished by the column address selecting one quarter of the total of columns (256) in each plane of the array simultaneously. Then each of the pixels connected to each of these columns receives the single color value in a color value register designated by the value carried on the data conductor in the particular color mode. It will be seen that in block 256 mode a total of thirty-two times thirty-two total eight bit pixels (1024 pixels) are affected at once by each write access. This is a typical number of pixels in a row of a modern computer color monitor. Thus, each access of eight bit pixels in block 256 mode may write all of the pixels in a 1024 pixel row. It will be appreciated that this mode may be used to very rapidly clear an entire screen or to write a pattern which varies in thirty-two bit blocks on the screen.

However, in any case in which two colors are written to the frame buffer in the same access using the block 256 mode, the data conductors are not available to provide signals indicating that a position is not to be written but only signals indicating the color to be written. For this reason, clipping of graphical data to fit within a window on the display cannot be accomplished in the modes in which two colors are written simultaneously. For this reason, it is necessary to utilize the color 0 and color 1 modes at the boundaries of a window in order to accomplish clipping of the window. These single color modes may be used at the window crossings at each side of each row containing a window to write a background color to the window edge on a first access and then to write a foreground color to the window edge on a second access. In a similar manner, because the granularity of the access is so large with the block 256 mode, it often must be used with the other modes to clip to a window edge. That is, since each control bit affects thirty-two pixels, block 256 mode can only select pixels to write and not write in adjacent groups of thirty-two pixels. Consequently, the block 256 mode must be used with block 8 mode to clip to an exact window edge.

Figure 7:
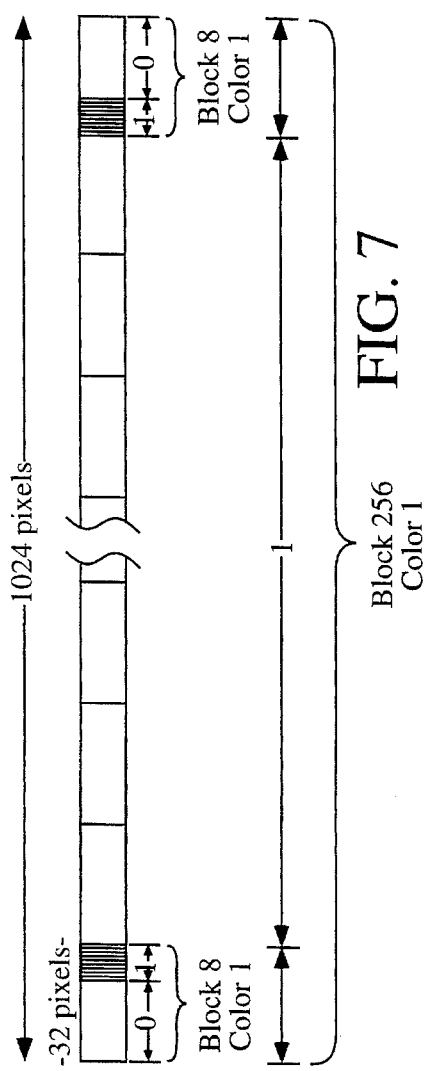
FIG. 7 is a diagram illustrating a method of accessing a frame buffer in very rapidly in accordance with the invention.

The block 256 mode is especially useful when used with the block eight mode to clear a window and clip to the boundaries of the window when using eight bit color. FIG. 7 illustrates the process by which a window may be cleared and clipped using the fast modes of color writing described above. FIG. 7 illustrates a portion of a display in which the different modes are applied. Color one mode may be used during a single access to clip the pixels outside the window at the left edge of the row in FIG. 7 while writing the background color to the pixels within the window. Color one mode may also be used to write background color within the window while ignoring the pixels outside the window at the right edge of the row containing the window in a single access. Then color one mode may be used to write the entire center portion of the window in block 256 mode with background color while ignoring those portions previously written at the window edge and the portions beyond. Thus, an entire line in a window may be cleared and clipped to the window in at most three accesses of the frame buffer requiring a total of 160 ns. It will be recognized that this is approximately five times as fast as this operation may be accomplished using block eight mode where thirty-two individual accesses are necessary for writing any row.

It will also be noted that only three addition write accesses requiring only a total of 60 ns. more using color zero mode are necessary to write the cleared line. This is approximately four times as fast as writing data in block eight mode alone.

A second additional mode is referred to as block 512 mode. In block 512 mode each data conductor affects the value of data written to thirty-two adjacent sixteen bit pixel positions. In this mode, the column address selects a total of half the columns in each plane simultaneously. This mode requires the increase in number of selection conductors, multiplexors 42, and other components discussed above to sixteen. This mode is used with the block 16 mode in the same manner that block 256 mode is used with block 8 mode to rapidly write to an entire row within a clipped window area of the display. A third additional mode is referred to as block 1024 mode. In block 1024 mode, all of the columns in each plane are selected simultaneously by the column address. This mode requires the increase in number of selection conductors, multiplexors 42, and other components discussed above to thirty-two. In block 1024 mode, each data conductor affects the value of data written to thirty-two adjacent thirty-two bit pixel positions. This mode is used with the block 32 mode in the same manner that block 256 mode is used with block 8 mode to rapidly write to an entire row within a clipped window area of the display. Each of these modes provides useful functions in the same manner as does block 256 mode but for configurations of frame buffers storing data describing sixteen bit and thirty-two bit pixels.

Thus, it may be seen that the arrangement of the present invention provides very rapid access when writing a frame buffer to accomplish operations affecting large blocks of data. All that is necessary is to utilize the various modes in groups selected to provide the most rapid access for the particular operation involved. In particular, the normal mode, the block eight mode, and the block 256 mode are utilized when the frame buffer is configured to store data in eight bit pixel positions. The normal mode, the block sixteen mode, and the block 512 mode are utilized when the frame buffer is configured to store data in sixteen bit pixel positions. The normal mode, the block thirty-two mode, and the block 1024 mode are utilized when the frame buffer is configured to store data in sixteen bit pixel positions.

It will be noted that in the block 256, 512, and 1024 modes of operation, a great number of memory devices are affected simultaneously. Those skilled in the art will recognize that this would normally require a great deal of power to accomplish since each of the drivers 53 must produce a sufficient amount of power to back drive a large number of individual sense amplifiers 43. In fact, such an operation could not be accomplished using prior art techniques. However, the present invention provides a unique method of overcoming this problem.

During the beginning of each RAS cycle, the sense amplifiers 43 are not yet turned on. If the column select devices are turned on to write to the appropriate columns on the falling edge of this RAS period when the sense amplifiers are off, the drivers 53 may write to the memory cells by writing around the sense amplifiers. Since the drivers 53 do not have to back drive the sense amplifiers 43 in order to effect the values stored in the memory cells 33, each of the memory cells 33 need only be driven sufficiently to register a new condition. Then, when the sense amplifiers 43 are turned on during the latter portion of the RAS cycle, these amplifiers 43 sense the new conditions as a part of the refresh process and automatically drive the memory cells to the correct conditions using the refresh process.

Figure 9:
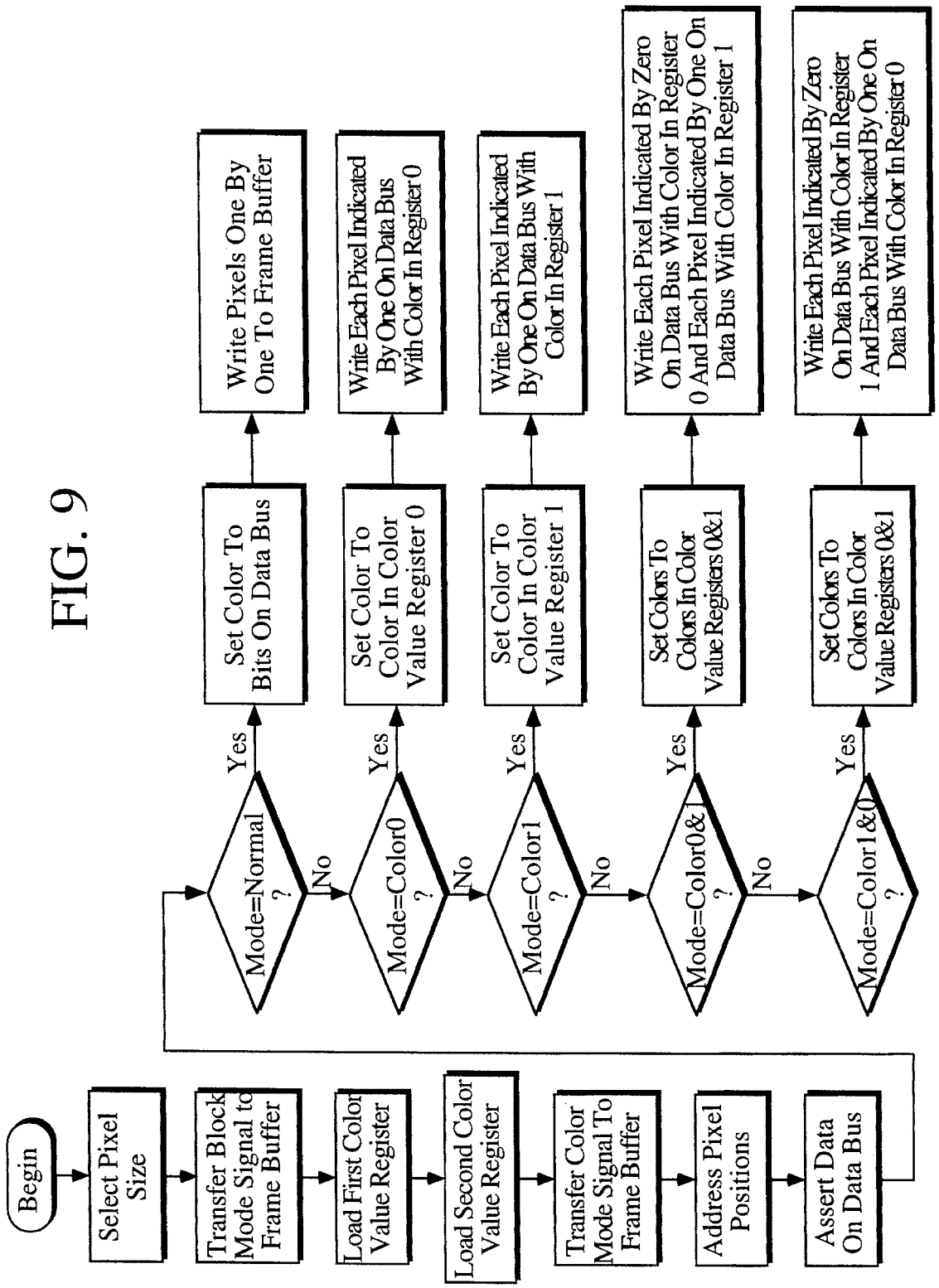
FIG. 9 is a flow chart illustrating a process for writing to a frame buffer in accordance with the invention.

In this manner, very large numbers of cells may be changed at once with only a minimum amount of power being required. FIG. 9 illustrates the steps of the process described above by which different blocks of pixels including complete rows of the frame buffer may be written using the different block modes described.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer system comprising a central processing unit, main memory, a busing system including a data bus having a number of data conductors, an output display, and a frame buffer joining the busing system to the output display, the frame buffer comprising an array of memory cells for storing data indicating pixels to be displayed on the output display, access circuitry for selecting memory cells in the array, first and second color value registers each for storing a number of bits equivalent to one color value, and circuitry for writing simultaneously color value data from the color value registers to a plurality of storage positions in the array which represent a number of individual pixels equivalent to the number of data conductors of the data busing system.

2. A computer system as claimed in claim 1 in which the circuitry for writing simultaneously color value data from the color value registers to a plurality of storage positions in the array comprises a plurality of multiplexors connected to each of the color value registers and to the data bus, and a source of control signals for causing the multiplexors to select color values from the color value registers or from the data bus.

3. A computer system as claimed in claim 2 in which the source of control signals for causing the multiplexors to select color values from the color value registers or from the data bus comprises circuitry for transferring control signals on the data bus to select color values from the color value registers.

4. A computer system as claimed in claim 3 further comprising circuitry for providing control signals for causing the multiplexors to select color values from the color value registers for storage in a plurality of storage positions equal to a number of pixels for each control signal on the data bus presented to select color values from the color value registers.

5. A computer system as claimed in claim 1 in which the circuitry for writing simultaneously color value data from the color value registers to a plurality of storage positions in the array which represent a number of individual pixels equivalent to the number of data conductors of the data busing system includes circuitry for writing from a single color value register to a plurality of storage positions in the array simultaneously.

6. A computer system as claimed in claim 1 in which the circuitry for writing simultaneously color value data from the color value registers to a plurality of storage positions in the array which represent a number of individual pixels equivalent to the number of data conductors of the data busing system includes circuitry for writing from both color value registers to a plurality of storage positions in the array simultaneously.

7. A frame buffer designed to be coupled to a data bus and to an output display in a computer system, the frame buffer comprising an array of memory cells for storing data indicating pixels to be displayed on the output display, access circuitry for selecting memory cells in the array, first and second color value registers each for storing a number of bits equivalent to one color value, and circuitry for writing simultaneously color value data from the color value registers to a plurality of storage positions in the array which represent a number of individual pixels equivalent to the number of data conductors of the data bus.

8. A frame buffer as claimed in claim 7 in which the circuitry for writing color value data from the color value registers to a plurality of storage positions in the array simultaneously comprises a plurality of multiplexors connected to each of the color value registers and to the data bus, and a source of control signals for causing the multiplexors to select color values from the color value registers and from the data bus.

9. A frame buffer as claimed in claim 8 in which the source of control signals for causing the multiplexors to select color values from the color value registers and from the data bus comprises circuitry for transferring control signals on the data bus to select color values from the color value registers.

10. A frame buffer as claimed in claim 9 further comprising circuitry for providing control signals for causing the multiplexors to select color values from the color value registers for storage in a plurality of storage positions equal to a number of pixels for each control signal on the data bus presented to select color values from the color value registers.

11. A frame buffer as claimed in claim 7 in which the circuitry for writing simultaneously color value data from the color value registers to a plurality of storage positions in the array which represent a number of individual pixels equivalent to the number of data conductors of the data bus comprises circuitry for writing from a single color value register to a plurality of storage positions in the array simultaneously.

12. A frame buffer as claimed in claim 11 in which the circuitry for writing simultaneously color value data from the color value registers to a plurality of storage positions in the array which represent a number of individual pixels equivalent to the number of data conductors of the data bus comprises circuitry for writing from both color value registers to a plurality of storage positions in the array simultaneously.

13. A frame buffer as claimed in claim 7 further comprising circuitry for writing simultaneously color value data from the color value registers to a plurality of storage positions in the array which represent a number of individual pixels equivalent to the number of pixels in a row of the display.

14. A frame buffer as claimed in claim 13 in which the circuitry for writing simultaneously color value data from the color value registers to a plurality of storage positions in the array which represent a number of individual pixels equivalent to the number of pixels in a row of the display comprises circuitry for writing to the plurality of storage positions during a row access strobe signal prior to refreshing the positions whereby a refresh operation will complete the write operation.

15. A frame buffer as claimed in claim 13 further comprising circuitry for writing color value data from the data conductors of the data bus to individual storage positions representing a single pixel on the display.

16. A method for writing to a frame buffer including an array of memory cells comprising the steps of:

writing a first color value to a first color value register of the frame buffer, writing a second color value to a second color value register of the frame buffer, selecting one of the color values in a color value register in response to a control signal value on any data conductor of a data bus to write to a plurality of memory cells simultaneously, and writing the selected color value to storage positions each representing an entire pixel on a display in response to the control signal value.

17. A method for writing to a frame buffer as claimed in claim 16 in which the control signal value on any data conductor of the data bus controls writing to storage positions representing a plurality of pixels on the display.

18. A method for writing to a frame buffer as claimed in claim 17 in which the step of writing the selected color value to storage positions each representing an entire pixel on the display may select pixels of eight, sixteen, or thirty-two bits.

19. A method for writing to a frame buffer as claimed in claim 16 in which the control signal value on any data conductor of the data bus controls writing to storage positions representing a single pixel on the display.

20. A method for writing to a frame buffer as claimed in claim 19 in which the step of writing the selected color value to storage positions each representing an entire pixel on the display may select pixels of eight, sixteen, or thirty-two bits.

21. A computer system comprising a central processing unit, main memory, a busing system including a data bus having a number of data conductors, an output display; and a frame buffer joining the busing system to the output display, the frame buffer including an array of memory cells for storing data indicating pixels to be displayed on the output display, access circuitry for selecting memory cells in the array, first and second color value registers each for storing a number of bits equivalent to one color value, and circuitry for writing simultaneously color value data from the color value registers to a plurality of storage positions in the array which represent a number of individual pixels equivalent to the number of data conductors of the data busing system, said circuitry for writing simultaneously color value data includes a plurality of multiplexors connected to each of the color value registers and to the data bus, and a source of control signals for causing the multiplexors to select color values from the color value registers or from the data bus, said source of control signals including circuitry for transferring control signals on the data bus to select color values from the color value registers, and circuitry for providing control signals for causing the multiplexors to select color values from the color value registers for storage in a plurality of storage positions equal to a number of pixels for each control signal on the data bus presented to select color values from the color value registers.

22. A computer system comprising a central processing unit, main memory, a busing system including a data bus having a number of data conductors, an output display; and a frame buffer joining the busing system to the output display, the frame buffer including an array of memory cells for storing data indicating pixels to be displayed on the output display, access circuitry for selecting memory cells in the array, first and second color value registers each for storing a number of bits equivalent to one color value, and circuitry for writing simultaneously color value data from the color value registers to a plurality of storage positions in the array which represent a number of individual pixels equivalent to the number of data conductors of the data busing system, said circuitry for writing simultaneously color value data registers includes circuitry for writing from a single color value register to a plurality of storage positions in the array simultaneously, and circuitry for writing from both color value registers to a plurality of storage positions in the array simultaneously.

23. A frame buffer designed to be coupled to a data bus and to an output display in a computer system, the frame buffer comprising an array of memory cells for storing data indicating pixels to be displayed on the output display, access circuitry for selecting memory cells in the array, first and second color value registers each capable of storing a number of bits equivalent to one color value, and said circuitry for writing simultaneously color value data from the color value registers includes circuitry for writing from a single color value register to a plurality of storage positions in the array simultaneously, and circuitry for writing from both color value registers to a plurality of storage positions in the array simultaneously.

24. A frame buffer designed to be coupled to a data bus and to an output display in a computer system, the frame buffer comprising an array of memory cells for storing data indicating pixels to be displayed on the output display, access circuitry for selecting memory cells in the array, first and second color value registers each capable of storing a number of bits equivalent to one color value, circuitry for writing simultaneously color value data from the color value data registers to a plurality of storage positions in the array which represent a number of individual pixels equivalent to the number of data conductors of the data bus, and circuitry for writing simultaneous color value data from the color value registers to a plurality of storage positions in the array which represent a number of individual pixels equivalent to the number of pixels in a row of the display.

* * * * *